US006355147B1

(12) United States Patent
Griffiths et al.

(10) Patent No.: US 6,355,147 B1
(45) Date of Patent: Mar. 12, 2002

(54) POROUS ELECTRODE APPARATUS FOR ELECTRODEPOSITION OF DETAILED METAL STRUCTURES OR MICROELECTRONIC INTERCONNECTIONS

(75) Inventors: Stewart K. Griffiths, Danville; Robert H. Nilson, Cardiff; Jill M. Hruby, Livermore, all of CA (US)

(73) Assignee: Sandia Corporation, Livermore, CA (US)

( * ) Notice: Subject to any disclaimer, the term of this patent is extended or adjusted under 35 U.S.C. 154(b) by 0 days.

(21) Appl. No.: 09/459,008

(22) Filed: Dec. 10, 1999

(51) Int. Cl.[7] .............................. C25B 9/00; C25C 7/00; C25D 17/00
(52) U.S. Cl. .................... 204/242; 204/DIG. 7; 204/284
(58) Field of Search .................. 204/283, 284, 204/DIG. 7, 242; 205/96, 97, 123, 148, 150, 70

(56) References Cited

U.S. PATENT DOCUMENTS 4,043,891 A * 8/1977 Alkire et al. ............ 204/230.7
4,367,127 A * 1/1983 Messing et al. ............ 205/566
4,466,864 A * 8/1984 Bacon et al. ............... 205/105

* cited by examiner

*Primary Examiner*—Kathryn Gorgos
*Assistant Examiner*—Wesley A. Nicolas
(74) *Attorney, Agent, or Firm*—Michael Hetherington; Timothy P. Evans

(57) ABSTRACT

An apparatus and procedure for performing microfabrication of detailed metal structures by electroforming metal deposits within small cavities. Two primary areas of application are: the LIGA process which manufactures complex three-dimensional metal parts and the damascene process used for electroplating line and via interconnections of microelectronic devices. A porous electrode held in contact or in close proximity with a plating substrate or mold top to ensure one-dimensional and uniform current flow into all mold cavities is used. Electrolyte is pumped over the exposed surface of the porous electrode to ensure uniform ion concentrations at this external surface. The porous electrode prevents electrolyte circulation within individual mold cavities, avoiding preferential enhancement of ion transport in cavities having favorable geometries. Both current flow and ion transport are one-dimensional and identical in all mold cavities, so all metal deposits grow at the same rate eliminating nonuniformities of the prior art.

17 Claims, 10 Drawing Sheets

Damascene Process

Improvements to
Damascene/LIGA Process

POROUS ELECTRODE APPARATUS FOR ELECTRODEPOSITION OF DETAILED METAL STRUCTURES OR MICROELECTRONIC INTERCONNECTIONS

STATEMENT OF GOVERNMENT INTEREST

The United States Government has rights in this invention pursuant to Contract No.DE-AC04-94AL85000 between the United States Department of Energy and the Sandia Corporation for the operation of the Sandia National Laboratories.

BACKGROUND

The field of the present invention relates generally to electroplating processes used to produce metal deposits having precise microscopic features. In particular, the field of the invention relates to the fabrication of LIGA microstructures and metallization of semiconductor devices, or to any process wherein metal is electrochemically deposited into lithographically produced molds containing a multiplicity of microscopic cavities such as trenches and holes.

The present invention is particularly beneficial in producing uniform voidfree deposits under adverse circumstances where there are large variations in the size and areal density of mold cavities or when these cavities are much deeper than their lateral dimensions.

The primary target technologies of the present invention are: (1) fabrication of microdevices by the LIGA process and (2) metallization of semiconductor devices. Each of these processes is separately described below, followed by an explanation of manufacturing difficulties that are remedied by the present invention. A common aspect of both target technologies is the need for uniform void-free plating of microscopic features having high aspect ratios.

LIGA Technology

LIGA, an acronym from the German words for lithography, electroforming and molding, is a promising new process for producing metal microdevices having micron to millimeter features. In the first step of LIGA, a photoresist (photosensitive or photo-definable) material is exposed to high-energy radiation through a patterned mask. This photoresist is then developed in a chemical bath which preferentially dissolves the exposed regions. The developed photoresist, bonded or clamped to a conducting substrate, subsequently serves as a mold to be filled with metal by electrodeposition. After filling of the mold cavities is complete, the mold is usually dissolved by chemical etching, leaving only the desired metal structure or a collection of finely detailed metal parts still attached to the substrate. In some cases, the resulting metal structure is not the final product but rather serves as a mold or die in the final step of mass production by injection molding or embossing.

Currently under worldwide development, this process offers a means to manufacture high resolution, high aspect-ratio metal devices including microscale valves, motors, solenoid actuators, and gear trains. Such devices cannot be fabricated either by silicon micromachining or by precision machine tool operations. The depth dimension of a typical LIGA structure ranges from about 10 microns to a few millimeters. Since the mold is generally fabricated from a flat sheet of photoresist, the depth of all mold cavities and that of all electroformed features is generally the same in a single-layer device. However, the lateral dimensions and geometries of individual features may be widely variable and highly complex. Features having aspect ratios (depth to width) greater than 10 pose a challenge to conventional electroplating, particularly for feature depths greater than 100 microns.

The LIGA process is applicable to a broad range of enabling technologies which require high aspect ratio microstructures such as microscale pumps, motors, valves, micro actuators, switches, positioners, or the like. As such, the LIGA process is ideal for miniaturizing mechanical components used in sensing and process control, computer peripherals, automotive, medical, and aerospace and defense applications.

The total market for microdevices is growing very rapidly and is estimated to be between approximately $3 billion and $14 billion per year by the year 2000 The potential for high aspect ratio metal devices in the total microdevice market depends strongly on exploiting the unique capability of LIGA-like processes to produce high aspect ratio microstructures, and on reducing product costs through improved manufacturing methods. The aspects of the invention described herein provide a solution to several outstanding problems in the LIGA manufacturing process and so should make possible an increase in the future market share for metal devices or microstructures produced by this and related electrodeposition processes.

LIGA Deficiencies

One difficult problem in the LIGA process is nonuniform deposition of metal within the mold. In all electroplating processes, geometric irregularities give rise to nonuniform electric current densities. Since electric currents drive the electrodeposition process, nonuniform currents give rise to nonuniform metal deposition rates. For example, the corners of a rectangular region will always have a local current density that exceeds the mean value for the surface by a significant factor. As a result, deposition rates at these corners will be greater than the average rate. Similarly, a hole in an otherwise uniform surface, sharp bends in a linear feature, or parallel linear features of irregular spacing will also give rise to nonuniform deposition rates near the geometric irregularity.

In conventional electroplating practice, robbers and shields are employed to improve metal deposition uniformity on surfaces of irregular geometries. Robbers are electrically conducting elements placed near the deposition surface with the intent of locally altering the electric potential to produce a more uniform current flux over the surface. The shape, position and electric potential of the robber must be carefully selected to produce the desired effect. In contrast, shields are electrically insulating elements usually placed between the bath electrode and the deposition surface. Their purpose, however, is the same as that of a robber to locally alter the current density to obtain a more uniform deposition rate. Like robbers, shields must be carefully designed and placed to produce the desired benefit.

Because of the very small feature sizes of LIGA molds, shields and robbers are not practical for micro molding of complex three dimensional structures . In principle, robbers could be designed as part of the LIGA mold, but this would require many iterations of the robber design to effectively achieve uniform deposition over the many features present in a typical LIGA part. Further, such integral robbers would likely limit the range of possible designs for the LIGA device. Special shields also could be fabricated using lithographic methods, but again these would require many trial-and-error iterations to be highly effective. Since shields and robbers are not very practical for the LIGA process, other techniques must be pursued to ensure uniform deposition in the LIGA mold.

Current practice in LIGA manufacturing is largely to tolerate nonuniform deposition or to attempt to correct it in an iterative fashion. The mold is periodically removed from the plating bath and inspected. Areas experiencing excessive deposition rates are coated with an insulating paint to inhibit further deposition in those areas, and the mold is then returned to the bath for an additional period of plating. This cycle is repeated until all cavities in the mold are filled. This is a costly and time-consuming practice that is not well suited to the mass production of LIGA parts. Therefore, to successfully develop the LIGA process as a flexible and cost-effective manufacturing method, a method is needed for solving the problem of nonuniform deposition in the mold. What is also needed is a method for providing uniform deposition of metal for complex three-dimensional microstructures. It also would be advantageous to provide a method for fabricating a uniform metal layer which is scalable and applicable to nanometer through micron size microstructures and devices.

Metallization of IC Devices

As Integrated Circuit devices continue to shrink in size, metal interconnects become the dominant limitation in circuit speed. Interconnect areal dimensions must shrink in proportion to the semiconductor devices, which reduces their conductivity. In order to compensate for this loss in conductivity, interconnects must be made taller, requiring a large aspect ratio. Achieving this large aspect ratio without voids in the structure is difficult using existing electroplating and metallization technology. For these reasons, interconnects potentially represent the largest technology gap for future generations of IC devices.

Aluminum to Copper

As device sizes get smaller, the electrical properties of aluminum will no longer meet the new semiconductor industry requirements. Copper interconnects provide the potential advantages of lower ohmic resistivity and increased resistance to electromigration. Thus, the change from aluminum to copper will help to further reduce chip dimensions. However, as the first chips so bearing copper interconnects are beginning to enter the market, the copper connector pioneers are experiencing difficulties, with yields in some cases close to zero. Only, an isolated few in the technology reportedly have managed 50 percent yields.

Despite these difficulties, Cu is expected to be adopted in deep submicron VLSI metallization due to its lower resistivity than conventional Al alloys. To implement Cu interconnects, the damascene process will be employed to overcome the low etch raters in dry-etching of Cu. However, this approach requires Cu to be deposited void-free in trench and via structures with fairly high aspect ratios. Chemical vapor deposition (CVD) and electroplating are the two most promising techniques that could meet this requirement. These two processes produce Cu deposits having different microstructures and, hence, differing electromigration characteristics. However, in either CVD or electrodeposition, it is extremely difficult to achieve void-free filling of high aspect ratio trenches and vias. This is because excessive material deposition at the top of these cavities may close them off, leaving voids below. As will be seen, the present invention helps to remedy this problem and thereby improve process yields.

Damascene Process

The semiconductor industry currently employs a conventional method called the damascene process to build copper interconnections on chip devices. The term damascene is borrowed from the way the Arab sword smiths of medieval Damascus inlaid their famous weapons. A typical single damascene process proceeds along the following steps. First, the trenches for the interconnects are etched into the dielectric. Second, a Cu diffusion barrier such as Tantalum (Ta) or Tantalum Nitride (TaN) is deposited to protect against Cu diffusion into the dielectric or active silicon devices. Third, the trench is filled. This step can be done by one of the following methods; electroless plating, electroplating, Chemical Vapor Deposition (CVD), or Physical Vapor Deposition (PVD). Finally, the excess Cu from the fill is removed by chemical mechanical polishing (CMP) to produce a planarized top surface.

If the fill is performed by CVD, it is extremely difficult to completely fill trenches and vias having aspect ratios greater than unity. Under ideal conditions of conformal deposition on all exposed surfaces, the deposition layers on the side walls grow uniformly toward one another leaving a progressively narrower void space. At the same time, the center void is filling from the bottom up. For aspect ratios less than one-half, the bottom-up filling will be complete before the side walls merge. At higher aspect ratios, however, the filling is completed by merging of the side walls, so any excess deposition near the top will cause closure before the bottom is filled completely. In the absence of a directional bias, deposition will generally occur preferentially near the top of the feature, since deposition near the bottom requires that material must be transported downward through a gap of progressively decreasing width. Thus, voids are likely to occur during CVD filling of trenches having aspect ratios greater than unity.

Alternatively, if the fill is performed by electrodeposition of Cu, it is first necessary to deposit a conducting "seed layer", usually Cu, that is generally quite thin compared to the feature widths but thick enough to carry the electric current needed for electrodeposition. Since the seed layer generally covers all exposed surfaces, electrodeposition will later occur on all of these surfaces. Moreover, since current densities and Cu ion concentrations are generally greatest on the exposed wafer face and the upper sidewalls of trenches or vias, metal deposition rates will be greatest at these locations, closing the cavity tops before the bottoms are completely filled. This difficulty can be offset, in part, by using "leveling agents" or plating inhibitors that are preferentially consumed in the regions of highest current near the top of the feature, but even this approach becomes less effective as feature depths and aspect ratios increase.

For these reasons, copper fill deposition is considered the most difficult part of the damascene process. At present, 0.25-micron wide vias and holes 1 micron deep are hard to fill completely without forming voids or small cracks. Yet, to facilitate closer packing and multilevel connections, trenches are getting proportionally deeper as they get narrower. With current technology, the deeper the trench, the more likely there will be defects. The goal is to get from 250 nanometers to 100 nanometers, at a 10-to-1 aspect ratio, far beyond the reach of current practice.

Multilayer IC architectures can be metallized using "dual-damascene" methods in which successive layers are built upon one another. Although such multilayer architectures are now deemed essential, it is currently said by some in the industry that "using copper is a multi-damascene integration nightmare." Yield is a touchy subject for fabrication plants, and hard data on copper production has yet to be disclosed. But it appears early results are disappointing. Critical flaws such as gaps in copper lines have brought yields for some operations down to well below acceptable levels. The electroplating apparatus disclosed here provides a new approach to metallization that alleviates many of the difficulties described above.

SUMMARY OF THE INVENTION

Several aspects of the present invention overcome the difficulties currently encountered in electroforming of metal deposits within the microscopic cavities of lithographically produced plating molds. The invention has two primary areas of application: (1) the LIGA process used to produce complex metal parts having microscopic details and (2) the damascene process used for electroplating the line and via interconnects of microelectronic devices.

In a conventional LIGA electroplating process, the plating rate within individual mold cavities depends upon a multitude of geometric factors such as cavity width dimensions, aspect ratios, spacing, areal density of features, and proximity to mold edges. As a result, overplating occurs in some areas of the mold while other areas remain only partially filled, requiring multiple cycles in which overplated metal is removed, some areas are masked off, and electroplating is resumed. Trapped voids and poor metal morphology are also commonly observed, resulting in lost yield. These difficulties are caused by two primary factors: (1) nonuniform current density resulting from three-dimensional redistribution of electric current in the space between the bath electrode and the mold top, and (2) nonuniform ion transport from the electrolyte bath to the plating surfaces in individual mold features. Similar difficulties arise in the electroplating of microelectronic interconnections.

An aspect of the invention solves the problem of nonuniform current flow by employing a porous electrode positioned adjacent to the plating mold, leaving little or no intervening space for current redistribution. The mold is sandwiched between the porous electrode and the conducting solid substrate on which the metal deposits are formed. Since the LIGA mold is nonconducting, the current flow between the porous electrode and the plating surface is purely one dimensional and the gradient of the electric potential between the top and bottom of the mold must be the same within every mold cavity.

Another aspect of the invention solves the problem of nonuniform transport of metal ions within different mold cavities. Electrolyte is pumped over the external face of the porous electrode to maintain a uniform ion concentration over that surface. However, the porous electrode prevents this external flow from causing electrolyte circulation within individual mold cavities, avoiding preferential enhancement of ion transport in features having favorable geometries such as shallow aspect ratios. By preventing these microscale fluid circulations, the present invention ensures that the ion transport within mold cavities will occur by only two processes, diffusion and ion drift. Since the concentration gradient and the electric field are both one dimensional and the same in each mold cavity, the transport of ionic species and dissolved hydrogen gas will be identical in each feature.

A third aspect of the invention eliminates the problems of ineffective bonding or uneven contact between the plating mold and the substrate that would otherwise lead to unintended underplating of the mold. In one preferred embodiment of the invention, the sandwiched assembly consisting of the porous electrode, mold, and substrate electrode is housed within a plating cell along with a compliant porous spacer that is compressed during assembly to apply the pressure needed to hold all components together. Electrolyte is pumped through the porous spacer to maintain a uniform ion concentration across the exposed dye face of the porous electrode.

In addition to LIGA applications, the invention can also be used for electroplating microelectronic interconnects. Here, the steady progression to smaller line widths requires that the lines become deeper to maintain the same conductance. This increases the aspect ratio, making it very difficult to fill the lines completely before closure occurs at the top of the plating mold which, in this case, is a nonconductive layer that has been patterned by lithograph and etching processes. The conventional damascene process currently used for copper plating requires that a conductive seed layer be applied to the entire surface of the mold, so that the sidewalls of the mold cavities are no longer insulators. Since this aggravates the problem of nonuniform filling, it may be desirable to remove some of the seed layer by a preferential etching process, so that the process become essentially equivalent to LIGA electroplating. Even if the seed layer is left in tact, the present invention can be used to prevent unwanted electroplating on the wafer face and to improve plating uniformity.

In either LIGA or microelectronics applications, the porous electrode can be pre-patterned by applying a patterned impermeable and/or insulating layer to the electrode surface that contacts the mold. This can be used to: (1) control the plating pattern on the substrate, (2) provide a plating mold that is attached to the porous electrode, (3) provide an electrical standoff that prevents shorting of the porous electrode to a conducting mold, or (4) provide a physical standoff to prevent shorting of the porous electrode to metal deposits reaching the top of a nonconducting mold. The pattern of the porous electrode could be produced by silk screening, selective etching, or even by use of addressable pixels that could locally permit or prevent ion transport.

BRIEF DESCRIPTION OF THE DRAWINGS

These and other aspects and advantages of the invention may be appreciated from the following detailed description together with the drawings in which.

DETAILED DESCRIPTION

An aspect of the invention enables electroforming of small and complex structures with greater uniformity than was previously possible. This aspect of the invention solves the problem of uneven electrodeposition rates due to irregular geometry and due to high aspect ratio features by employing a porous electrode positioned adjacent to the electrodeposition mold. The proper use of this porous electrode provides an electroplating process having the following characteristics: (1) the electric potential is substantially uniform across the mold top, (2) the ion concentration is substantially uniform across the mold top, and (3) the electrolyte within each cavity is substantially stagnant. These three conditions are sufficient to provide substantially uniform electrodeposition within mold cavities of various widths, shapes, aspect ratios, and areal density, provided that the mold is a nonconductor as it is in LIGA applications. In cases where the mold walls are electrical conductors, as in some microelectronics applications, the present invention still provides substantial benefits over prior art.

Problems With Prior Art: LIGA

Figure 1:
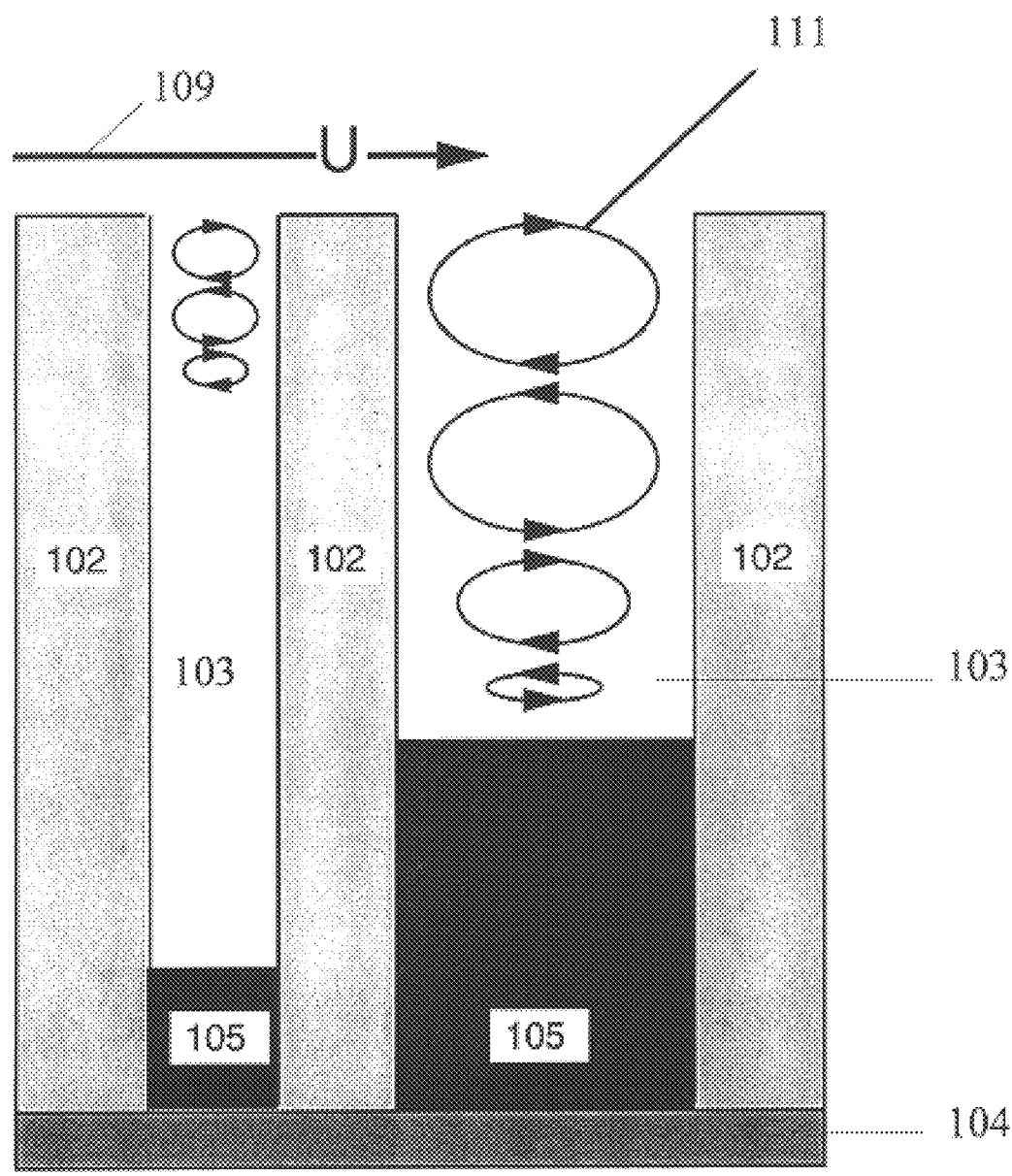
FIG. 1 (prior art) shows a schematic of nonuniform deposition in a LIGA mold.
Figure 1:

The uneven electrodeposition produced by a conventional LIGA process is illustrated schematically in FIG. 1. The nonconducting mold 102 generally contains a large number of open cavities 103 such as holes and trenches that are created by lithographic and chemical etching processes prior to electrodeposition; only two representative cavities are shown in the sketch. A conducting electrode 104 is bonded to the bottom of the mold or held in contact with it by an external fixture (not shown). This electrode serves as a substrate for the growth of electrodeposits 105 within the mold cavities. In a conventional process, the opposing electrode (not shown) is generally a solid metal surface, often made from the metal that is to be deposited. It is usually located relatively far from the mold, relative to feature scales, so that it will not obstruct the flow of metal ions from the bath into the mold cavities. A power supply (not shown) is used to control the electric potentials of the two electrodes and thereby control the associated current flow and the overall rate of electrodeposition.

Nonuniform plating of LIGA features, like that shown in FIG. 1, results from two primary problems: (1) nonuniformity of the electric field and/or (2) nonuniformity of the ion transport to plating surfaces. The latter of these is illustrated schematically in FIG. 1. It is common practice in LIGA electroplating to stir the bath or to pump electrolyte toward or across the top of the mold so that that metal ion concentrations are as uniform as possible across the mold top and are nearly the same as the bulk ion concentrations in the bath. Otherwise the plating will be uneven and, if ion depletion becomes severe enough, there will be excessive production of hydrogen gas at the plating surface and degradation of the deposit morphology.

Such stirring of the bath, though generally deemed necessary in the art, is not without negative consequences. As shown schematically in FIG. 1, the electrolyte velocity 109 across the mold top produces shear forces that drive recirculating convection cells 111 within the individual mold features. In cavities having aspect ratios greater than about two, a multiplicity of these convection cells are formed, each cell having an aspect ratio of about unity, and each with a circulation speed that is more than ten time slower than the cell immediately above. Such fluid motions are capable of transporting metal ions from the bath to the plating surface far more efficiently than would occur by diffusion alone in a stagnant fluid column. However, the strength of this convective transport is highly dependent on the cavity aspect ratio, since the number of recirculation cells is roughly equal to the aspect ratio, and the motion is ten fold weaker in each successive cell. Thus, the convective transport near the mold bottom decreases by two orders of magnitude when the aspect ratio is increased from two to four. Weaker ion transport results in slower plating rates and hence smaller deposits in high aspect ratio cavities, as indicated schematically by the different deposit heights in FIG. 1. The final result is nonuniform filling of the mold.

Figure 2:
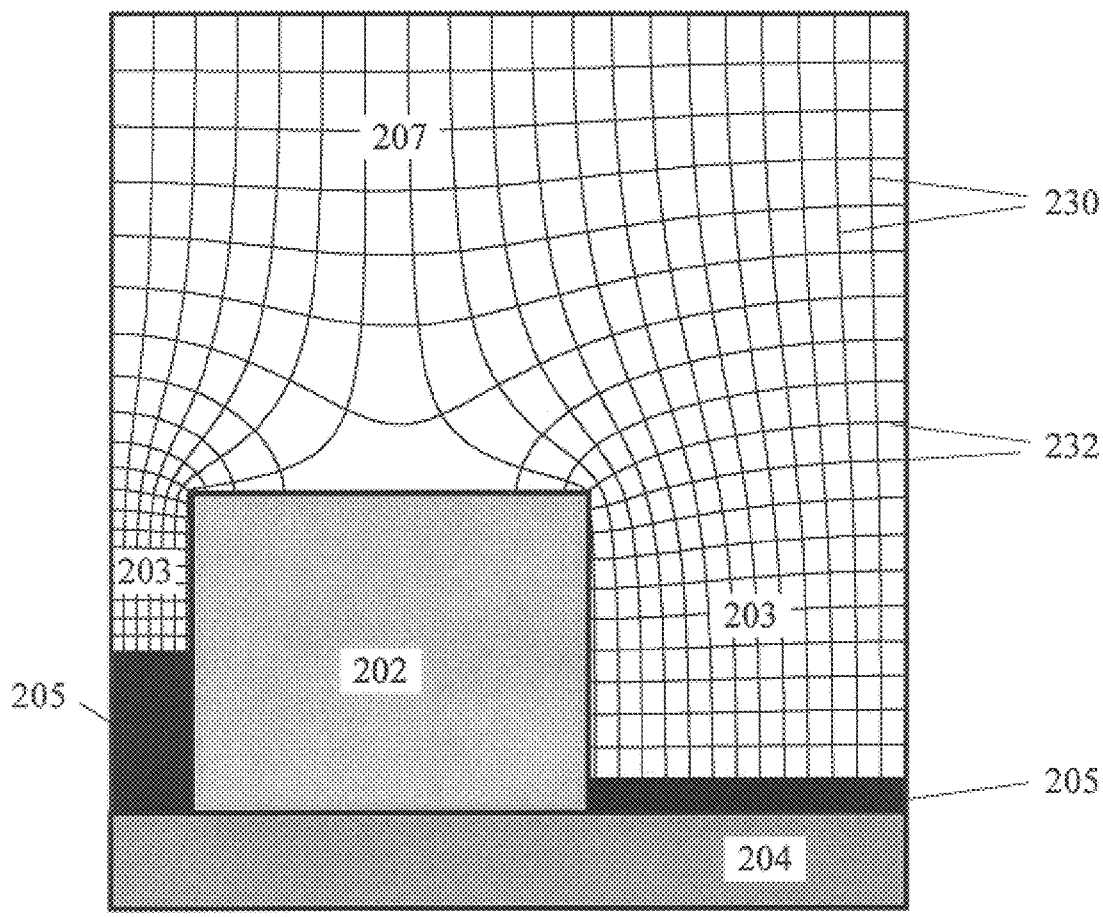
FIG. 2 (prior art) shows a schematic of the nonuniform electric field in a conventional LIGA process.

The other primary source of nonuniform deposition is illustrated schematically in FIG. 2 where the numbering of the mold 202, mold cavities 203, substrate 204, and metal deposits 205 is similar to that in FIG. 1. Here the mold element 202 serves as divider between the two trench-like mold cavities 203. Only one half of each mold cavity is shown, since the electric field is symmetric about the center plane of each trench. The electric field above the plating mold is illustrated by the mesh of lines 207 consisting of current flow lines 230 and equipotential lines 232. Further, since the mold is a nonconductor, the current flow or flux lines 230 are nearly parallel within each mold cavity. However, in the electrolyte bath 207 above the mold, the flux lines bend into each of the cavities, such that the current density within each depends on the relative size and spacing of the trenches. Since deposition rates are proportional to current density, these nonuniformities in current lead to nonuniform rates of mold filling. Analogous nonuniformities also occur on larger scales if some areas of the mold have a higher density of features, and hence greater current density, than other areas. Other sources of nonuniformity include turns, bends, and intersections of trench-like mold cavities as well as local flux concentrations near the edges and corners of the overall mold.

Any nonuniformity in the initial deposition rates will generally grow worse over time. This is because the current supplied to each cavity depends, in part, on the current path length between the opposing electrodes. Thus, a faster growing deposit shortens the conduction path length more rapidly than a slower growing neighbor. In addition, the diffusion path for metal ions is shortened as the deposits grow toward the mold top, further reinforcing the enhanced growth rate of the fastest growing deposits. The end result is that some deposits, or portions thereof, reach the top of the mold and begin to spread laterally across the top while other regions of the mold remain only partially filled.

Concept of the Present Invention

Figure 3:
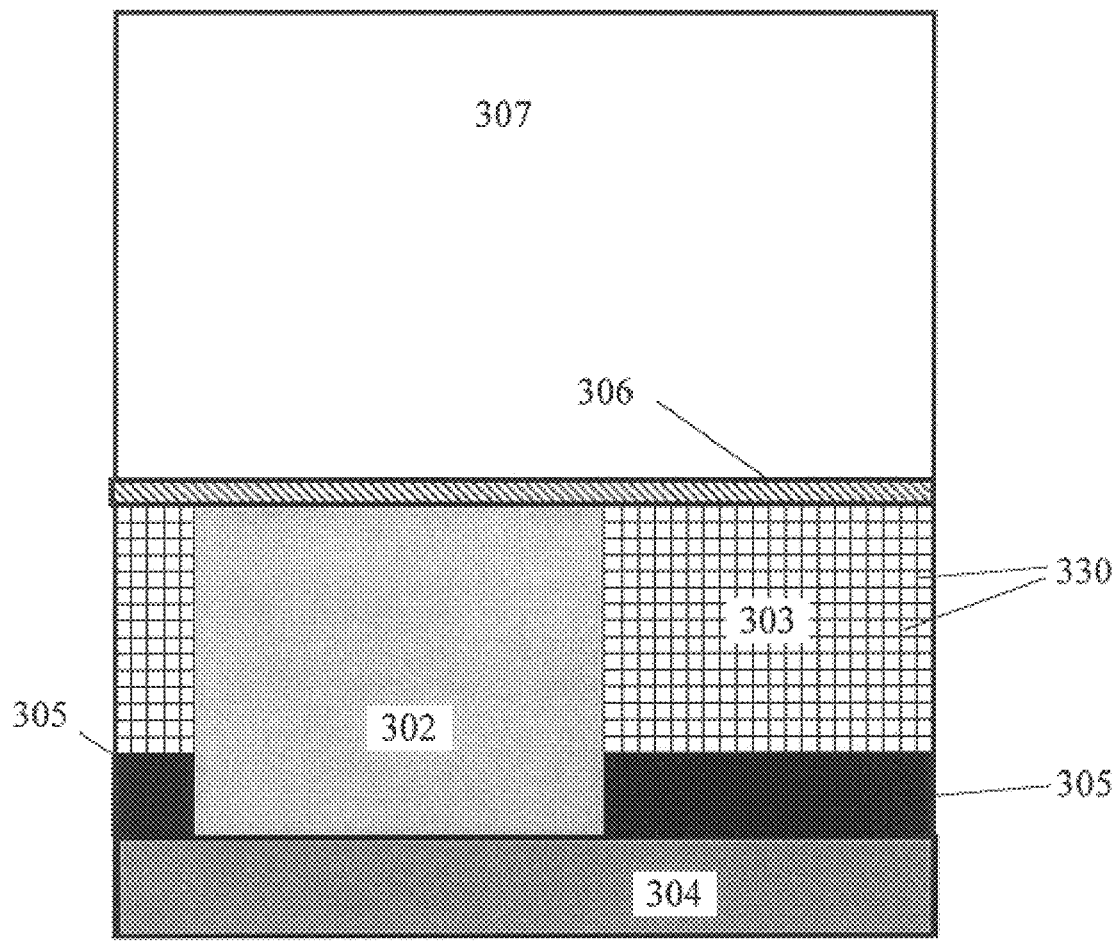
FIG. 3 shows a feature-scale schematic of the present invention.

The present invention, illustrated schematically in FIG. 3, dramatically reduces the nonuniformities in plating rates associated with both nonuniform current distributions and with nonuniformity of convective transport. The most unique and essential feature of the invention is the use of a porous electrode 306 that is in contact with the top surface of the mold or, in some cases, raised slightly above by a nonconducting spacer having the same open pattern as the mold. Other components of the apparatus include: the mold 302, mold cavities 303, substrate 304, and metal deposits 305. The region 307 above the porous electrode is generally filled with electrolyte. However, since the electric current flows between the porous electrode 306 and the plating substrate 304 in this embodiment of the invention, there are no electric field lines shown in the region 307 above the porous electrode.

The porosity of the electrode 306 permits diffusion of metal ions and other chemical species into and out of the mold cavities 303. Since there little or no bending of current lines 330 above the mold, each mold cavity receives the same current density. In addition the porous electrode nearly or totally eliminates the transmission of fluid shear forces from the bath to the electrolyte in the mold cavities. Thus, ion transport within each cavity occurs only by diffusion through the concentration gradient and by ion drift induced by the electric field. Since the vertical concentration gradient and electric field gradient are the same in all cavities, the current flow and ion transport are identical in all cavities and all deposits grow at the same rate.

Figure 4:
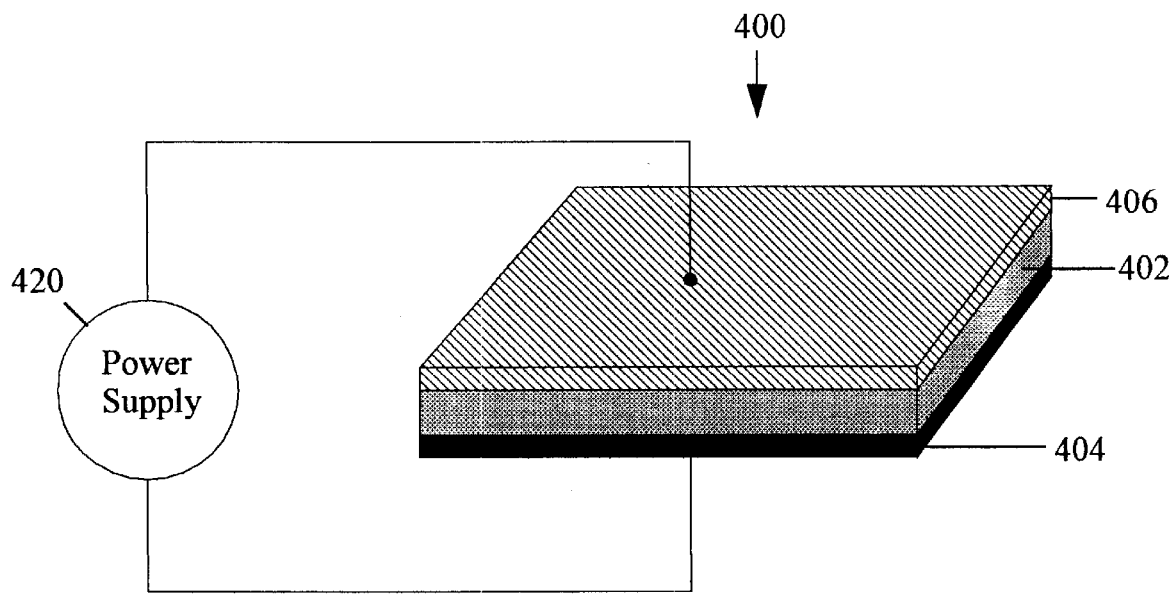
FIG. 4 shows a schematic of a first embodiment of the invention.

First Embodiment:

Referring now to the larger scale view in FIG. 4, the plating mold 402 is essentially sandwiched between a conducting solid substrate 404 and a porous electrode 406. The positioning of the mold 402 between the conducting substrate 404 and porous electrode 406, and the fact that the mold 402 is non conducting, enable the gradient of the electric potential supplied by power supply 420 between the top and bottom, or first and second major surfaces of the mold 402 to be the same within every cavity of the mold.

The assembly 400 comprising the conducting substrate 404, deposition mold 402 and porous electrode 406 is submerged in a conventional plating bath so that all mold cavities and the porous electrode are fully saturated with electrolyte. The assembly 400 is held together with a clamping fixture (not shown) like those commonly used to hold the plating substrate tight against the mold bottom. As is well understood by those skilled in the art, the clamp should only contact those portions of the mold top where ion transport and current flow to the mold cavities will not be disrupted. The porous electrode is quite beneficial in this regard, since the clamping fixture now holds the two electrodes together, rather than being interposed between the electrodes, as in the conventional practice.

The porous electrode 406 permits metal ion transport between the plating bath and upper, electrode contacting surface of mold 402. Power supply 420 applies a voltage between the porous electrode 406 and conducting substrate 404. Currents from the applied voltage result in the uniform electrodeposition of metal within cavities of mold 402.

By agitating the plating solution and/or assembly 400, ion concentrations at the exposed surface of the electrode 406 are maintained at a uniform and constant value. However, since the porous electrode prevents transmission of fluid shear forces, there is negligible bulk fluid motion within cavities. Thus, the porous electrode gains the benefit of bath stirring without the detriment of fluid motion within the cavities. As explained earlier, such fluid motion causes nonuniform ion transport and nonuniform deposition rates within cavities having different aspect ratios.

Porous Electrode

The porous electrode, properly implemented, ensures that both the electric potential and the metal ion concentration will be substantially uniform across the top or first surface of the mold 402 adjacent to the porous electrode 406. Consequently, the current density over every portion of every cavity in the plating mold will be substantially the same, and thus the metal deposition rate will be uniform within the mold 402.

The porous electrode 406 comprises a particular material or may comprise a plurality of interconnected fibers or fiber composite. The porous electrode 406 also may comprise a microscreen or perforated plate. Regardless of its microstructure, however, this electrode must satisfy four important criteria.

(1) The porous electrode 406 must be thin enough that the resistance to diffusion through the electrode does not lead to ion depletion at the top or adjacent surface of the mold 402.

(2) The in-plane electrical properties of the porous electrode 406 must be uniform on a scale down to the size of the mold cavities in order that the electric potential at the top or adjacent surface of the mold 102 is the same for all neighboring cavities.

(3) The in-plane electrical resistivity of the porous electrode 406 must be small enough that the electric potential is uniform over the entire mold surface.

(4) The porosity of the porous electrode must be large enough that diffusion through the mold 402 is not impeded, and thus does not lead to ion depletion at the top surface of mold 402 adjacent porous electrode 406. The porosity-of the porous electrode also must be large enough so as to prevent the accumulation of hydrogen gas inside or below the porous electrode 406.

It is important to note that the first criterion must satisfy competing objectives with respect to the third and fourth criteria above. The in-plane electrical resistivity of a very thin and highly porous electrode will necessarily be large. Likewise, a thick and dense electrode would have low electrical resistance.

A thick and dense electrode also would be characterized by low effective diffusivity. Such low diffusivity and thickness would result in significant ion depletion.

The pore spacing on the mold contacting side of porous electrode 406 must be sufficiently fine to allow ion transport into all mold cavities. This porosity need not be continuous through the thickness of the porous electrode 406. By grading the porosity, fiber size, mesh, or lattice spacing through the thickness of porous electrode 406, performance of the electrode with respect to the four design criteria is improved. Similarly, different mesh or screens may be stacked or nested to achieve similar goals. For example, a large chip-scale mesh could be employed as a backplane for lower in-plane resistivity with excellent ion-transport properties, while a thin mold-contacting feature-scale fine mesh is used to provide a uniform electric potential within each cavity.

Patterned Electrode:

The porous electrode 406 could be manufactured to have relatively uniform porosity over all of its surface, but could also be manufactured with part of the surface intentionally masked off to prevent ion transport through these areas and thereby locally inhibit plating. Such a pattern may be fixed for particular screen (i.e. a pre-pattern) or actively altered with a smart-screen (explained below) to produce any desired pattern.

The porous electrode 406 could be pre-patterned, similar to a silk-screening process known to those in the art. If the pre-patterned layer is sufficiently thick it may serve as the mold in which metal is deposited. In this instance, the porous electrode is fabricated with the mold 402 attached, and then placed into contact with the substrate 404. The mold could be sacrificial such that the mold 402 is destroyed or dissolved to release the metal part(s) after the plating process has concluded.

Alternatively, this pre-patterning process could be used to produce an electrically-insulating standoff on the porous electrode 406 to prevent electrical shorting of the porous electrode to a conducting mold surface (as in a proposed IC metallization process) or to the fill material as it is being plated. Additional standoffs or spacers could be formed as needed for a particular design or process. Note that the lithograph masks used to produce a standoff would be geometrically identical to those used to create the corresponding plating mold.

Alternatively, a smart-screen could be employed to produce a variable plating pattern on substrate 404 with or without the use of a plating mold. A smart-screen consists of an array of actively addressable pixels which can selectively allow or disallow plating to occur in desired areas of the substrate. The open areas of the mold permeable to metal ions could be held fixed during plating of a particular structure or altered during different periods of plating to produce metal features having different heights on the same substrate. In some applications involving shallow features, this technology could also be implemented without a mold to allow rapid, on-the-fly changes in the design of devices being manufactured using the present invention.

Remedies for Hydrogen Bubble Formation

If plating rates are sufficiently large, the rate of hydrogen generation at the plating surface may exceed the amount that can be steadily removed by diffusion through the electrolyte and through the porous electrode. If the hydrogen buildup exceeds the solubility limit, bubbles will form, disrupting the transport of ions to the plating surface and preventing complete filling of the mold. Such bubble formation can often be avoided by using moderate plating rates or, equivalently, by intermittent plating at higher rates. If faster plating is desired, bubble formation can be prevented by applying an overpressure to the electrolyte in the plating apparatus, thereby increasing the hydrogen solubility proportionally with the pressure. The second embodiment of the invention, explained below, is particularly useful in facilitating such pressurization.

If bubble formation is permitted, it is desirable that the plating surface of the substrate 404 be faced upward so that bubbles will rise upward, away from the plating surface and toward the porous electrode 406. Transport of bubbles through the porous electrode can be assisted by adding a surfactant to the plating chemistry, thereby reducing bubble sizes. Release of small bubbles from solid surfaces and their transport through the porous electrode may also be aided by mechanical agitation and/or by ultra-sonic excitation of the electrolyte or the entire apparatus.

Accumulation of hydrogen bubbles beneath the porous electrode can also be eliminated by using a porous electrode material capable of storing large amounts of hydrogen in the form of a metal hydride. Palladium, for example, can store hydrogen at densities comparable to those of a liquid. The hydrogen accumulated during a plating run can be subsequently released from the metal screen by exposure to a low-hydrogen atmosphere. The rate of hydrogen release can also be increased by heating the hydrided metal.

Second Embodiment: Plating Cell

Figure 5:
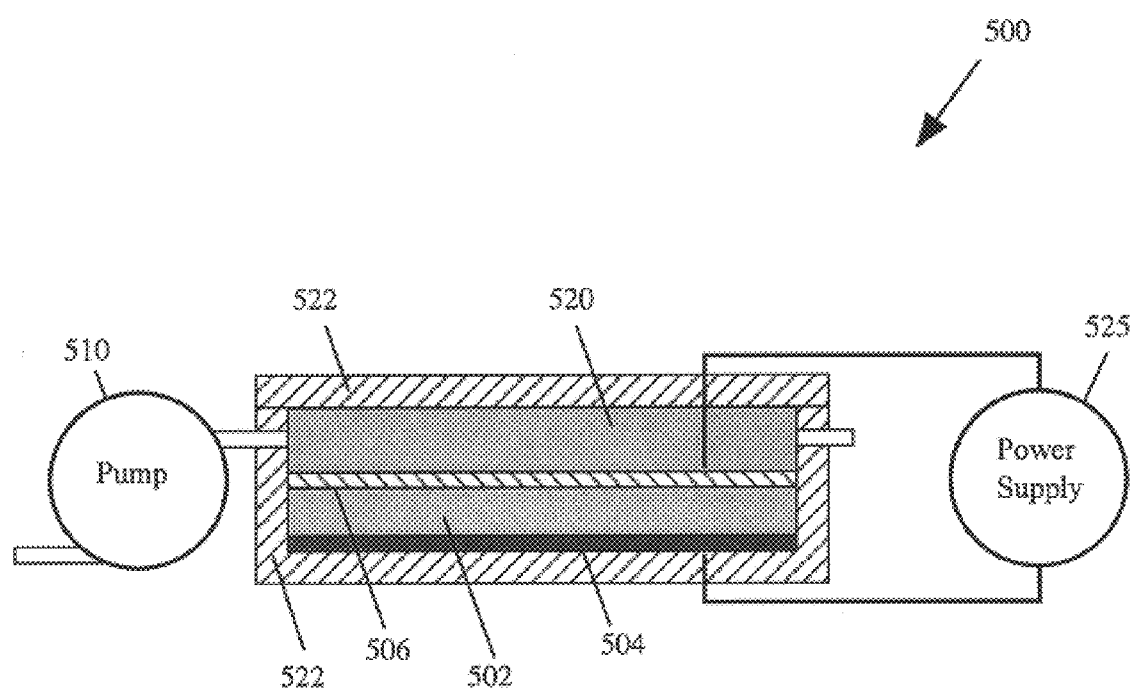
FIG. 5 shows a schematic of a second embodiment of the invention.

In a second embodiment of the invention, illustrated in FIG. 5, the substrate 504, mold 502, porous electrode 506 and a porous non conducting spacer 520 are enclosed in a flow-through cell housing 522. In this embodiment, an electrolyte is circulated by pump 510 through the porous spacer 520 adjacent to the porous electrode 506 at a rate sufficient to maintain uniform and constant ion concentrations at the outer surface of the electrode 506 in contact with the mold 502.

An assembly 500 comprises the conducting substrate 504, mold 502, and porous electrode 506 which along with porous nonconducting spacer 520 are enclosed in a housing 522. A pump 510 is used to circulate the electrolyte from an external reservoir (not shown) through the plating apparatus and return it to the reservoir. As in conventional electroplating, the reservoir is maintained at uniform and constant ion concentrations by well known methods.

Unique to the present apparatus, plating solution is circulated through the porous spacer 520 to supply metal ions for the electrodeposition process. The porous spacer 520 is generally made from a compliant material that, in the absence of confinement, is somewhat thicker than the space it will occupy within the housing 522. When the apparatus is assembled, compression of the porous spacer 520 produces the pressure needed to press the electrode sheets, 504 and 506, tightly against the adjacent mold surfaces.

Power supply 525 applies a voltage between the porous electrode 506 and conducting substrate 504. Current from the applied voltage between the porous electrode 506 and the conducting substrate 504 result in the uniform electrodeposition of metal within cavities of mold 502. By providing sufficient flow of electrolyte through the porous spacer, ion concentrations at the exposed surface of the porous electrode 506 are maintained at a uniform and constant value.

This embodiment solves many practical problems unique to LIGA that do not appear in conventional electroplating. By confining the mold 502, substrate electrode 504 and porous electrode 506 inside a cell housing 522, the mold 502 need not be bonded to the conducting substrate 504. The porous spacer 520 provides enough pressure on the porous electrode 506 and mold 502 to hold the mold 502 firmly against the conducting substrate 504. This provides an adequate seal between the mold 502 and conducting substrate 504 and prevents underplating of the mold. This approach overcomes the conventional problems of mold bowing and detachment of the mold from the substrate.

The problems of mold bowing and detachment typically arise when the mold and substrate, having dissimilar coefficients of thermal expansion, are bonded together and then heated from ambient temperature to the elevated temperature of the plating solution. Even very slight gaps between the mold and substrate will allow plating to occur beneath the mold in unintended regions. Conventional clamps often make matters worse by applying localized forces that bend thin parts; such clamps may also impede ion transport and current flow near contacted points on the mold. In contrast, the present invention provides a uniform clamping pressure over all mold and substrate surfaces, while also permitting thermal expansion of adjacent parts as well as uniform ion and current flow into the tops of the mold cavities. This approach also eliminates the need for bonding of the mold to the substrate, as this bonding process may inadvertently mask off some of the intended plating surfaces.

Another advantage of the enclosed plating cell is that it facilitates evacuation of the mold cavities prior to the introduction of electrolyte. This helps to ensure that all mold cavities will be fully saturated. Similarly, the enclosed cell facilitates pressurization of the electrolyte to prevent the formation of hydrogen bubbles during plating.

Third Embodiment: Floating Electrode Implemented in Electrolyte Bath

Figure 6:
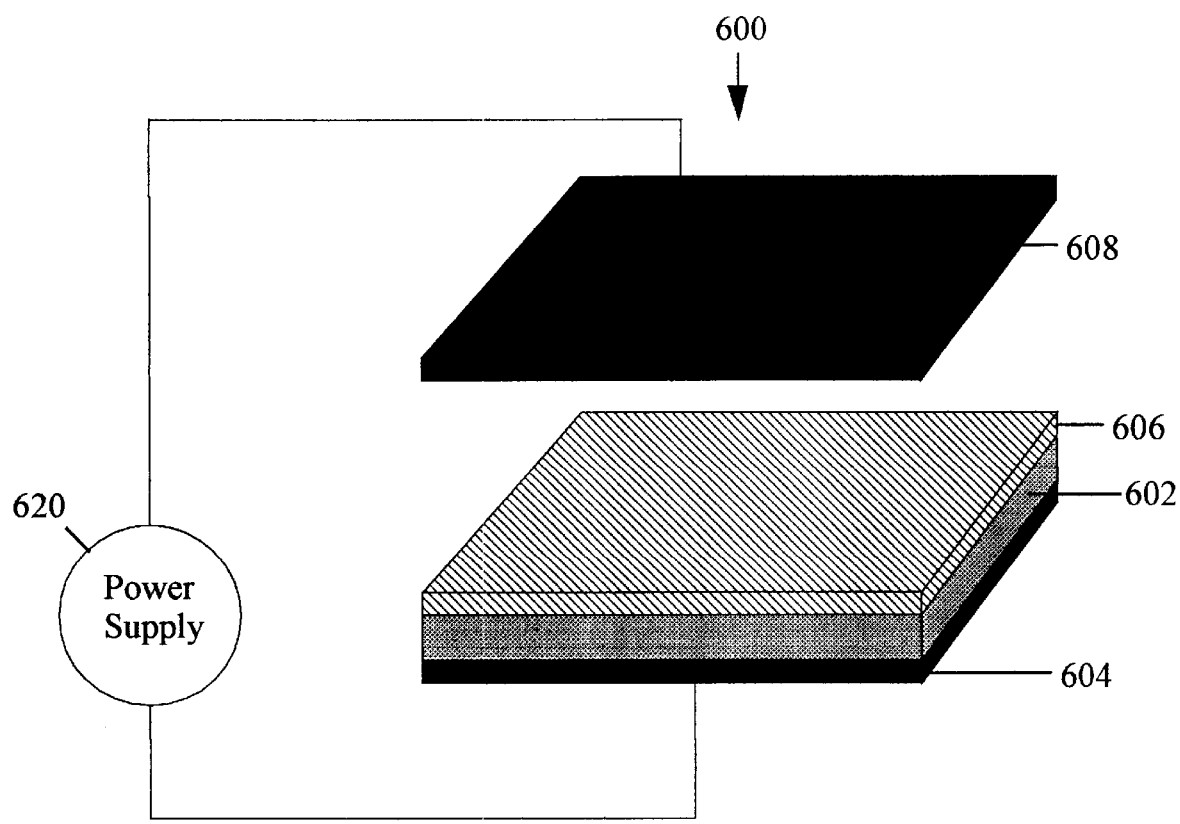
FIG. 6 shows a schematic of a third embodiment of the invention.

Referring to FIG. 6, another embodiment of the invention comprises a mold 602 sandwiched between a conducting solid substrate 604 and a floating porous electrode 606. This assembly 600 is held together with a clamping fixture (not shown) and is submerged in a plating bath. As in the previous embodiments, the porous floating electrode 606 permits metal ion diffusion between the plating bath and upper, electrode contacting surface of mold 602. However, in contrast to those previous embodiments, the porous electrode is not connected directly to the power supply.

Instead, the power supply 620 controls the voltage level and current flow between the "active" electrode 608 and the substrate electrode 604. Thus, the electrochemical reaction that previously occurred at the porous electrode surface now occurs at the active electrode 608. The floating porous electrode 606 is so named because it "floats" at a substantially uniform electric potential intermediate between that of the active and substrate electrodes. The positioning of the mold 602 between the conducting substrate 604 and floating porous electrode 606, and the fact that the mold 602 is non conducting, enable the gradient of the electric potential between the first and second major surfaces of the mold 602 to be the same within every cavity of the mold. Also, by agitating the bath and/or the mold and electrode assembly, ion concentrations at the exposed surface of the floating porous electrode 606 are maintained at a uniform and constant value. Under these conditions, current flow from the applied voltage results in the uniform electrodeposition of metal within cavities of mold 602.

The addition of an active electrode 608 is an enhancement over the first embodiment. Since there is no need for ion transport through the active electrode 608, it can be either a solid or a screen with greater thickness and larger granularity than the floating electrode. Thus, it is easier to ensure that the electric potential will be uniform across the surface of the active electrode, so that a relatively uniform current will be supplied to the top surface of the floating electrode. In this sense, the active electrode plays a role similar to the backbone conductors mentioned earlier in discussing the concept of a two-layer porous electrode.

The configuration of FIG. 6 provides a more uniform current distribution and a relaxation of some of the constraints regarding the porous electrode mentioned in the first embodiment. In particular, the in-plane conductivity of the porous electrode can be substantially reduced because it is only needed to make moderate local adjustments in the current distribution. Thus, the floating porous electrode 606 can be made thinner and more porous, to better accommodate ion fluxes and hydrogen transport through electrode 606. A finer scale of fibers or granularity also becomes more practical when long range in-plane current flow is not required.

Another advantage of the floating porous electrode 606 is a reduced likelihood of plugging or corrosion damage that might be caused by local electrochemical reactions. In this configuration the primary counter electrode reaction occurs at the active electrode 608, which may even be intentionally consumed to replenish the plated metal ion species. The floating porous electrode 606 acts mainly in a passive role to equalize the potential at the surface of the mold 602, though some amount of surface reaction is generally required even in this capacity.

Ion transport may also be enhanced by the configuration of FIG. 6. Two physical mechanisms are primarily responsible for ion transport into and through the porous electrode adjacent to the mold. The first of these is diffusion driven by the ion concentration gradient. The second mechanism is ion drift driven by the electric field. The later of these will be enhanced when there are favorable electric field gradients both above and below the porous electrode. When the power supply is connected between the porous electrode 606 and the plating surface 604 (as in FIG. 4) there is no potential gradient in the electrolyte above the porous electrode. However, such a favorable gradient is produced when the porous electrode 606 lies between the active electrode 608 and the plating surface, 604.

The floating porous electrode 606 comprises a particulate material or may comprise a plurality of interconnected fibers or fiber composite construction. The porous electrode 606 also may comprise a microscreen or perforated plate. Regardless of its microstructure, however, this electrode must satisfy the four important criteria declared in the first embodiment. However, the third requirement calling for adequate in-plane conductivity is greatly reduced by the presence of the active electrode. Thus, the competing objectives of the third criterion with respect to the first and forth criteria are diminished but not completely removed. The design of the active electrode can be of a solid, screen or smart screen type. Similarly the porous floating electrode can be either a screen, a patterned screen, or a smart screen.

A separate power supply could be added to force the electrical potential of the porous electrode 606 to a specific value. This represents a compromise between the first and third embodiments since the porous electrode 606 is sharing the duty as a counter electrode with the active electrode 608. This combination offers added process control.

Fourth Embodiment: Floating Porous Electrode in a Plating Cell

Figure 7:
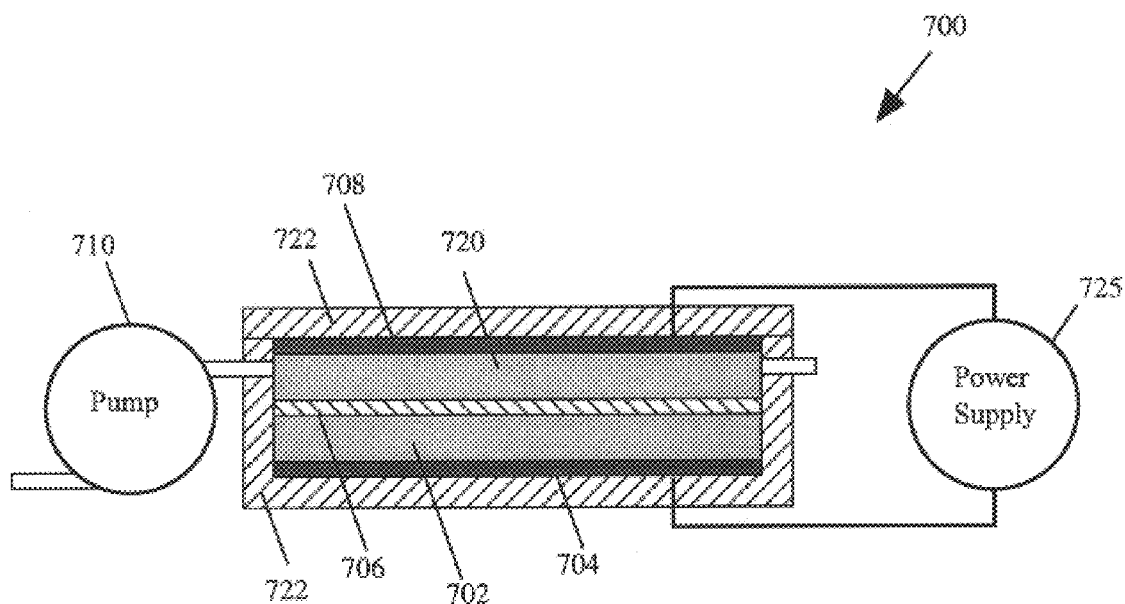
FIG. 7 shows a schematic of a fourth embodiment of the invention.

In a forth embodiment of the invention, illustrated in FIG. 7, the plating substrate 704, mold 702, floating porous electrode 706, porous non conducting spacer 720, and active electrode 708 are enclosed in a flow-through cell housing 722. In this embodiment, an electrolyte is circulated by pump 710 through the porous spacer 720 adjacent to the porous electrode 706 at a rate sufficient to maintain uniform and constant ion concentrations at the outer surface of the porous electrode 706 in contact with the mold 702.

The fourth embodiment is essentially the same as the second embodiment with the following exceptions: (1) the active electrode 708 has been added at the top of the plating cell, (2) the power supply 725 is connected between the active electrode 708 and the plating substrate 704, (3) the porous electrode 706 either floats at an intermediate voltage or is connected to a separate power supply as explained just above.

An assembly 700 comprises the conducting substrate 704, mold 702, and porous electrode 706, porous non-conducting spacer 720, and active electrode 708 which are all enclosed in a housing 722. Plating solution is circulated from an electrolyte reservoir (not shown) through the plating assembly and back to the reservoir by the pump 710. Plating solution is circulated through the porous spacer 720 to supply metal ions for the electrodeposition process. The spacer 720 additionally holds the floating porous electrode 706 against the upper or electrode contacting surface of mold 702. Spacer 720 presses the mold 702 onto the adjacent surface of conducting substrate 704. This also eliminates the need for bonding of mold 702 to the conducting substrate 704. A sufficiently high circulation rate of the plating solution is used to ensure that ion depletion is avoided at the interface between porous electrode 706 and mold 702.

As in the second embodiment, the use of the plating cell 700 eliminates the need for a conventional plating bath by using a closed system with recirculating solution. However, an electrolyte reservoir (not shown) will generally be used to fill and to drain the assembly 700 before and after plating. This reservoir will usually remain in the circulation loop during the electroplating process to ensure that the chemistry of the electrolyte remains constant throughout plating. The reservoir and plating cell may be pressurized to prevent hydrogen bubble formation; vibration or ultrasound may be used to promote bubble detachment.

Spacer 720 applies a uniform force to the mold. This function could also be served by a series of electrically insulated springs. As in the third embodiment above, the active electrode 708, is one of three types; solid, screen or smart screen. The general phenomenological operation of this embodiment is the same as in embodiment 3 with the addition of the surrounding cell enclosure housing 722.

The application of the foregoing aspects of the present invention are not limited to the LIGA process. The porous electrode method and apparatus should find application in many manufacturing technologies traditionally served by conventional electroplating and electroforming processes in which the intent is to produce geometric features on a small scale. Such applications include many variants of LIGA in which the mold cavity is produced by a means other than high-energy lithography, as well as the patterning of flat surfaces such as in forming electrical interconnects for microelectronics manufacturing or integrated circuit fabrication. Also, as explained below, the present invention may be used to improve damascene plating of electrical interconnections.

Description of a Conventional Damascene Process:

Many processes commonly used in metallization of microelectronic devices are very complex. A simple process is described hereir for the purposes of illustration. Formation of diffusion barriers and the like are omitted from this simple representation.

Figure 8:
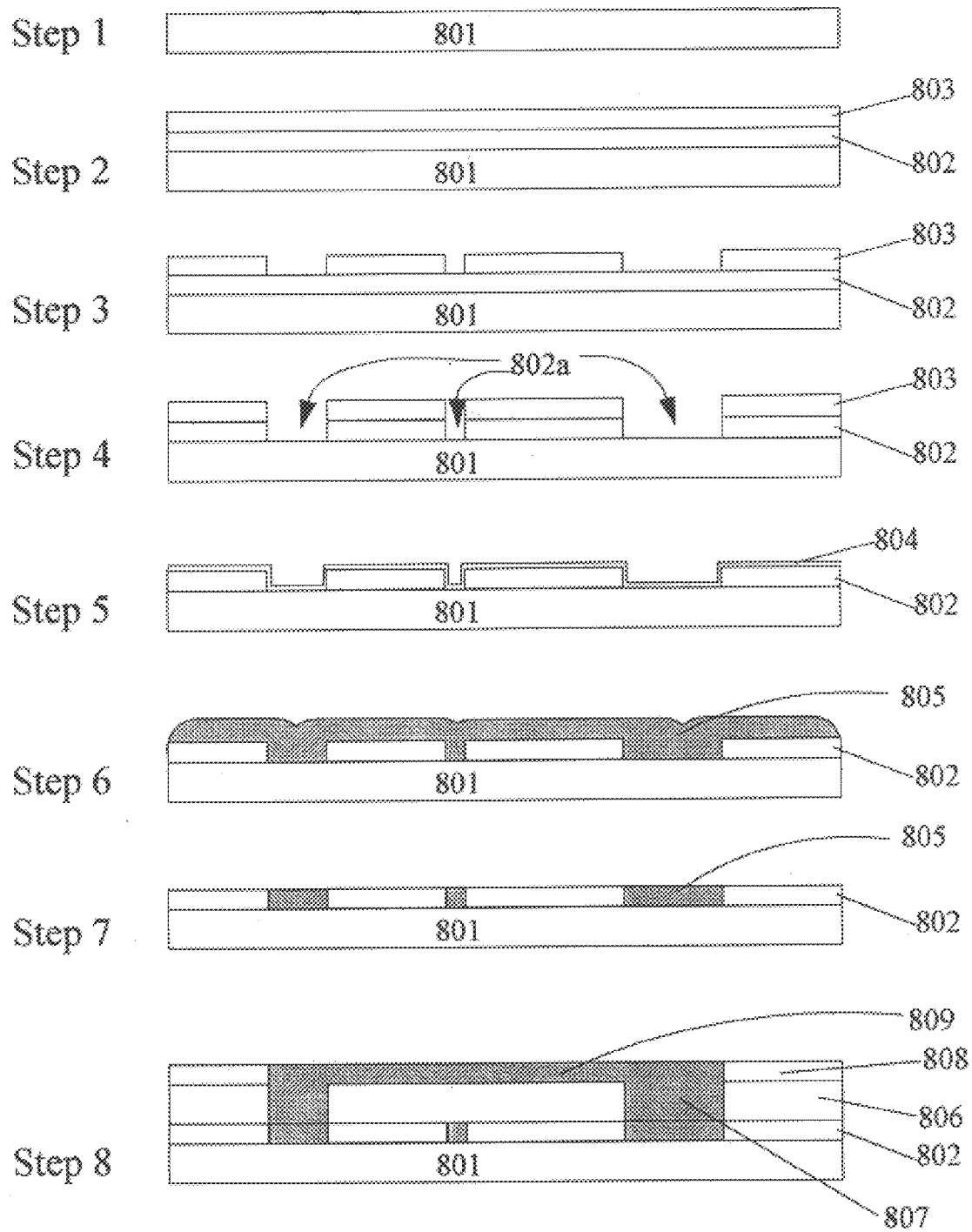
FIG. 8 shows a conventional multi-level interconnect structure.

Step 1 in FIG. 8 shows a cross-section of a portion of a substrate 801 upon which a damascene process is to be applied.

Step 2 in FIG. 8 shows said substrate 801 upon which a dielectric or insulating material 802 is deposited. A photosensitive or photo-definable material 803 is then deposited on top of said dielectric material 802 for the purpose of defining a pattern. Dielectric material could also be a photosensitive material, eliminating the need for two separate layers.

In step 3 of FIG. 8, said photosensitive material 803 is patterned lithographically, removing selective portions to expose upper surface of dielectric material 802.

In step 4 of FIG. 8, lithographic pattern is transferred into dielectric material 802 by an etching process, forming trenches 802a into said dielectric material 802.

In step 8 of FIG. 8, photosensitive material 803 is removed, and a conductive plating seed 804 is uniformly deposited.

In step 6 of FIG. 8, a plating process is employed to fill trenches 802a with desired plating material 805. Said plating material 805 extends above trenches 802a. If the present invention were to be employed at this step, electrically-insulating standoffs between the porous electrode and the material being plated are needed. Such standoffs were described earlier in the context of patterned porous electrodes.

In step 7 of FIG. 8, Chemical-Mechanical polishing or similar process is used to remove portions of plating material 805 extending above trenches 802a.

Step 8 of FIG. 8 illustrates a second interconnect layer being formed using this damascene process. An interlayer dielectric material 806 and metal plugs 807 are formed using the same process as is described in steps 2 through 7 to connect a first interconnect layer to a second interconnect layer. A second interconnect layer conductor 809 and dielectric 808 are then formed using the same process as described in steps 2 through 7.

Figure 9:
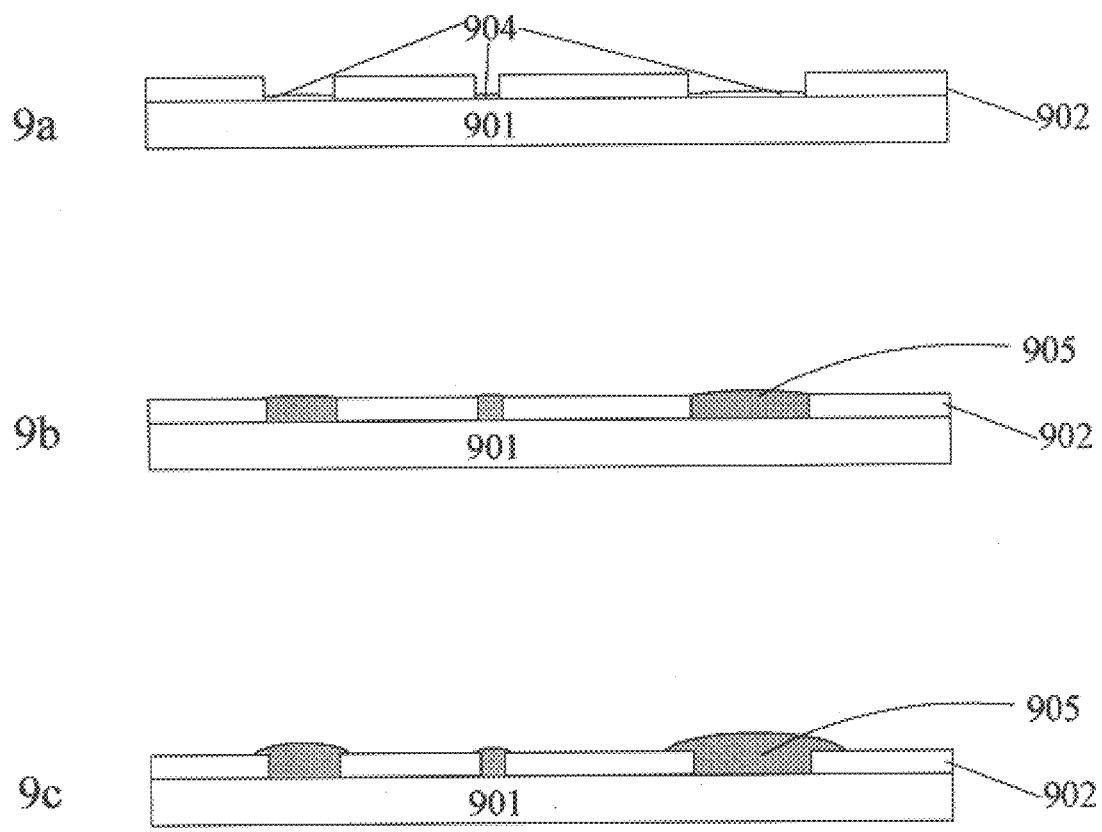
FIG. 9 shows the improvements to a typical multi-level interconnect process in accordance with an aspect of the invention.

Modified Damascene Process of the Present Invention:

FIG. 9 illustrates improvements to damascene processing which are achieved according to an aspect of the present invention. Assuming substrate 901 is conducting, or a conducting blanket exists between substrate 901 and mold 902 to interconnect all vias and trenches to the electroplating substrate 901 (as would be the case in a typical LIGA process), then the present invention can be applied as explained earlier to directly fill a structure similar to that shown in FIG. 8, step 4. Preferably, the material at the base of trenches 802a can serve as the plating seed. Otherwise a plating seed layer 904 must be deposited in the bottom of the trenches prior to filling by electrodeposition.

If an additional plating seed is required, the preferred method would be to blanket deposit seed 804 as shown in FIG. 8, step 5. Following this, Chemical-Mechanical polishing or similar process is used to remove portions of said plating seed 804 lying above trenches 802a. A high-angle directional etch as is known in the art is then performed to remove plating seed from sidewalls of trenches, thereby producing the configuration in FIG. 9a with a plating seed layer 904 at the bottom of each trench. FIG. 9b illustrates the fill material 905 following a plating process employing the present invention. The fill material extends minimally above trenches, eliminating the need for post-plating CMP, or greatly reducing CMP cycle time. Trenches and vias are uniformly filled without voids.

As noted earlier, shorting between the porous electrode and the growing deposits can be avoided by including standoff insulators on the bottom side of the porous electrode. In most LIGA a standoff is unnecessary, since the mold need not be filled all the way to the top and the mold is not a conductor. In metallization applications, however, complete filling may be preferred and the mold may be a conductor.

FIG. 9c shows a similar structure produced without employing the present invention. Plating extends significantly above some mold cavities to achieve complete fill of other cavities. High aspect ratio features may incorporate undesirable voids.

Figure 10:
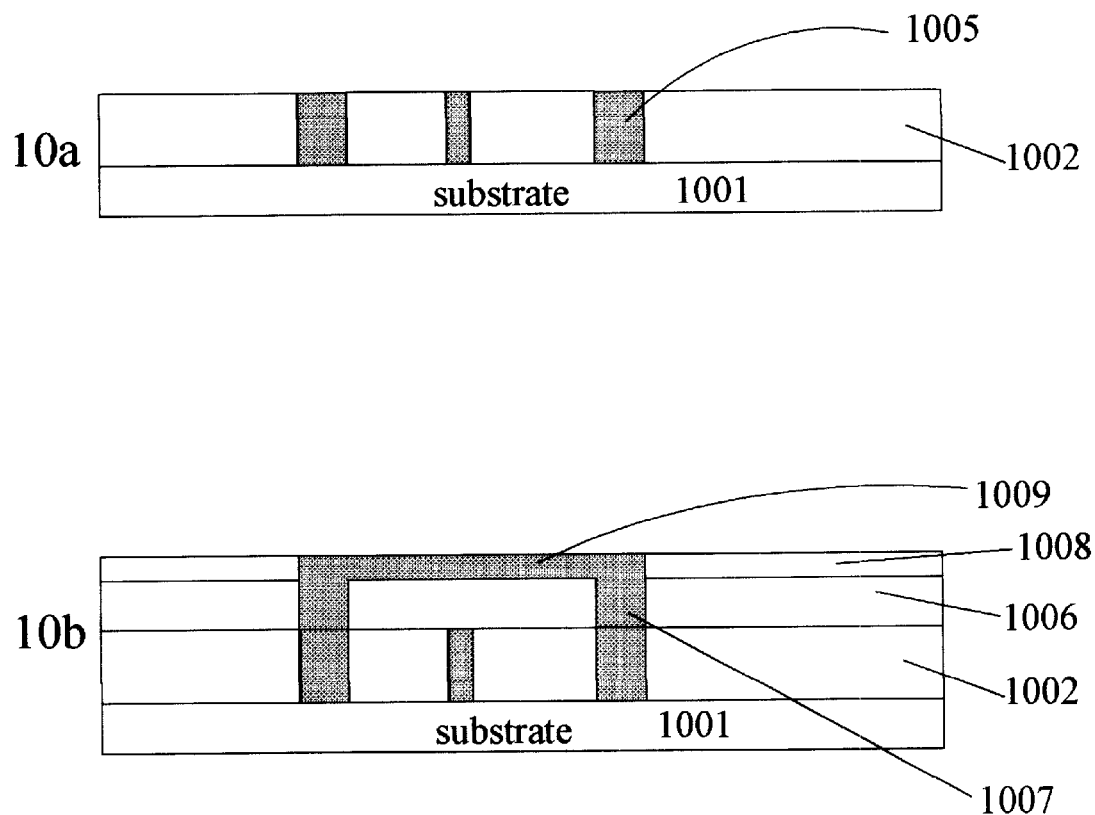
FIG. 10 schematically illustrates multi-level interconnects fabricated in accordance with an aspect of the present invention.

FIG. 10 illustrates the improvements offered by the present invention. In the single damascene process of FIG. 10a, the metal deposits 1005 are formed in the cavities of mold 1002 by electrodeposition onto substrate 1001. In the multi-damascene process shown in FIG. 10b, electrodeposits 1007 and 1009 are built upon substrate 1001 in three stages using three different molds: 1002, 1006, and 1008. As feature dimensions shrink below 100 nm, etching and filling of the needed high aspect ratio structures will be challenging. Dual damascene metal structures as shown in FIG. 8 are expected to become especially difficult. FIG. 10a illustrates minimal overplating of plating material 1005. Because the present invention offers improved uniformity, overplating of faster-plating areas is unnecessary or minimal. This improvement reduces or eliminates the polishing normally required after each plating stage. Also, because the present invention offers better fill properties, higher aspect ratio features such as plating material 1005 and metal plugs 1007 are possible. Thus, the areal density of interconnects can be increased while electrical conductivity is preserved or improved by making taller lines.

FIG. 10b illustrates increased interconnect density, as illustrated by a more compact interconnect structure and closer spacing of metal plugs 1007 and higher aspect ratio features when compared to FIG. 8, step 8. Because the present invention offers improved plating into trenches having a higher aspect ratio than trenches 802a without voids, higher density without sacrificing interconnect conductivity is possible.

As shown in FIG. 10, the invention enables the fabrication of devices with higher aspect ratios, greater densities and more complicated internal structures than previously possible. The invention also enables such devices to be manufactured in fewer steps.

New interconnect materials such as copper are needed to reduce parasitic RC delays. For some manufacturers, the upper metal layers will transition to copper before underlying layers make the same transition since the upper layers have a more critical RC delay. Also, since copper contamination of the semiconductor is not fully understood and controlled, lower layers pose more of a contamination control problem. The transition to copper must employ techniques that can provide economical, void-free filling of trenches and vias. This transition to copper is facilitated by the foregoing aspects of the present invention.

Another problem with conventional damascene processing which is solved by the present invention is CMP-induced dishing and erosion of inter-layer dielectric material for a given range of pattern densities. Since an aspect of the present invention allows reduced overplating and uniform plating into various geometries as shown in FIG. 10a, less polishing is required, and therefore less dishing and erosion occur in the interlayer dielectric material. Corrosion and scratching of metal structures being polished are also minimized.

Benefits of Modified Damascene Process in Accordance with the Invention

Potential semiconductor industry applications and the specific requirements which could be met with aspects of the invention as shown in FIG. 10 are discussed below.

Copper will be replacing aluminum interconnect material as feature sizes are reduced below 100 nm. Use of copper will require development of diffusion barrier materials and processing approaches to accomplish interconnects. Electromigration characteristics improve with the introduction of Cu, but will need further improvement at dimensions in the neighborhood of 70 nm. The invention provides a method to construct high aspect ratio interconnects (refer to FIG. 10) which will improve the electromigration characteristics using Cu. As stated above, trenches or vias are becoming proportionally deeper and narrower to provide increases in device density. Deep trenches etched into the dielectric must be filled completely, without voids or defects. Typically, the deeper the trench, the more likely there will be defects because or the corresponding increase in asperities and geometrically "tight" areas to plate. An aspect of the invention provides a uniform current density at irregular surfaces. This is accomplished via electric flux lines which reach the substrate more orthogonal to the surface than is possible with current technology. The perpendicular entering lines of flux promote even plating of material 1005 onto trench bottoms, thereby uniformly filling the vias, without voids and defects.

Other Improvements to the Damascene Process

In addition to the unconventional damascene process described above, it is also possible to employ the present invention in a less radical alteration of the conventional practice. In this embodiment, the conventional process of FIG. 8 would proceed as usual through step 5. The present invention would then be used to perform the plating process in step 6. The plating would utilize a patterned or smart porous electrode with nonconducting standoffs between the porous electrode and the seed layer 804, as explained earlier. The patterned electrode could be made using the same mask pattern as that used to in lithographic patterning of the insulator material 802 that serves as the plating mold. The plating process would be performed using the same plating inhibitors and leveling agents that are presently used to prevent excessive plating on the cavity sidewalls. The required amounts of these inhibitors will be greatly decreased by using the present invention to mask off the top face of the wafer.

The primary advantages of the present invention in this embodiment are (1) elimination of plating on the top face of the wafer, (2) improved uniformity of the current density within mold cavities having different geometry and/or aspect ratios, (3) improved uniformity of the current density over parts of the wafer having different densities of plated features, and (4) reduction in required amounts of copper and plating inhibitors.

All of these benefits, and others more substantial, are also realized in the previously described modified damascene process wherein the seed layer is removed from the top surface of the wafer and from the cavity side walls. However, that modified process does require additional etching to remove unwanted portions of the seed layer; it may also require a multiplicity of electrical connections between the power supply and the remaining seed layer at the bottom of the mold cavities, since the seed layer is no longer continuous over the entire wafer topography. Thus, partial removal of the seed layer may only be warranted when it is necessary to fill narrow cavities with high aspect ratios, as in future devices having smaller features. Under less challenging circumstances it may be easier to leave the seed layer in tact and simply use the present invention to make a less dramatic improvement in the conventional damascene process.

ESH

The need for proactive approaches to ESH (Environmental Safety and Health) using safer solvents, abating volatile organic compounds at point-of-use, minimizing waste, dry processing, and eliminating heavy metals used in masks are possible ways to meet the ESH requirements. The plating bath life must be extended and chemical measurement and replenishment or recycling addressed to reduce costs. Using the invention, uniform distributed electroplating can minimize the use of plating solutions, chemical-mechanical polishing slurries and eliminate throw-away defective chips not meeting design or performance specifications. Also, less electrolyte, solvent and processing fluid would be needed.

While the invention has been described in connection with what are presently considered to be the most practical and preferred embodiments, it is to be understood that the invention is not limited to the disclosed embodiments, but rather is intended to cover various modifications and equivalent arrangements which are included with the spirit and scope of the following claims.

We claim:

1. A device for performing uniform void-free electrodeposition of detailed metal structures, electrical interconnections, and patterned metal layers, or the like comprising:

a conducting substrate providing a plating surface on which metal ions are deposited;

a porous electrode having sufficient porosity to permit transport of said metal ions through said porous electrode;

a nonconducting plating mold sandwiched between said porous electrode and said conducting substrate, said nonconducting plating mold comprising one or more cavities; and a uniform electric potential impressed between said conducting substrate and said porous electrode.

2. The device of claim 1, wherein said porous electrode has at least one face on which a pattern is applied so that a part of said at least one face is no longer permeable to said metal ions.

3. The device of claim 1, wherein at least one face of said porous electrode has a pattern applied that provides an insulating spacer between said porous electrode and said conducting substrate.

4. The device of claim 1, wherein each of said one or more cavities is defined by one or more sidewalls extending to top and bottom surfaces of said nonconducting plating mold.

5. The device of claim 4, wherein said nonconducting plating mold, said porous electrode and said conducting substrate are immersed in an electrolyte solution comprising said metal ions thereby filling each of said one or more cavities with a quantity of said electrolyte solution, and wherein said electric potential causes an electric current to flow within each of said one or more cavities thereby causing an electrodeposition of said metal ions such that metal deposits are formed within each one of said one or more cavities to provide said metal structures, said electrical interconnections, said patterned metal layers, or the like.

6. The device of claim 5, further comprising means for maintaining a uniform metal ion concentration over an external face of said porous electrode.

7. The device according to claim 6, further comprising:

an active electrode submerged in said electrolyte solution facing but not in immediate contact with said porous electrode; and means for applying an electric potential between said conducting substrate and said active electrode to establish and maintain a current flow from said active electrode through said porous electrode to said conducting substrate.

8. The device according to claim 7, wherein said active electrode comprises a material selected from the group consisting of a solid plate and a screen.

9. The device according to claim 7, further comprising a means for maintaining a desired electric potential between said conducting substrate and said porous electrode.

10. The device according to claim 6, wherein said conducting substrate and said porous electrode are enclosed in a flow-through cell, wherein said means for maintaining comprises a pump means for moving said electrolyte solution by convection over said external face of said porous electrode at a rate sufficient to maintain uniform metal ion concentration over said external face.

11. The device according to claim 10, further comprising:

an active electrode contained within said flow-through cell, said active electrode facing toward, but not in immediate contact with, said porous electrode; and means for applying an electric potential between said conducting substrate and said active electrode to establish and maintain said current flow from said active electrode through said porous electrode to said conducting substrate.

12. The device according to claim 11, further comprising a means for maintaining a desired electric potential difference between said conducting substrate and said porous electrode.

13. The device according to claim 10, wherein a porous nonconducting spacer is placed adjacent to said external face of said porous electrode and is compressed within said flow-through cell to apply a pressure that maintains close contact between said conducting substrate, said nonconducting plating mold, and said porous electrode without the need for bonding, such that said electrolyte solution is able to flow through said porous nonconducting spacer to maintain a uniform ion concentration over said external face.

14. The device according to claim 13, further comprising:

an active electrode contained within said flow-through cell such that said porous nonconducting spacer is sandwiched between said active electrode and said porous electrode, and means for applying an electric potential between said conducting substrate and said active electrode to establish and maintain a current flow from said active electrode through said porous electrode to said conducting substrate.

15. The device according to claim 14, further comprising a means for maintaining a desired electric potential between said conducting substrate and said porous electrode.

16. The device of claim 1, wherein said porous electrode comprises a material permeable to metal ions and which is selected from the group of materials consisting of particulates, fibers, perforated solids, composite microstructures, microscreens, a mesh, a lattice, a sieve, a porous membrane, and a structure comprising two or more layers of these materials, said porous electrode providing an equipotential surface for producing uniform ion deposition on said conducting substrate.

17. The porous electrode according to claim 16, wherein at least one face of said porous electrode is provided with a pattern such that parts of said face are no longer permeable.

* * * * *